United States Patent [19]
Reiff

[11] Patent Number: 5,535,354
[45] Date of Patent: Jul. 9, 1996

[54] METHOD FOR ADDRESSING A BLOCK ADDRESSABLE MEMORY USING A GRAY CODE

[75] Inventor: Francis H. Reiff, Manitou Springs, Colo.

[73] Assignee: Digital Equipment Corporation, Maynard, Mass.

[21] Appl. No.: 200,931

[22] Filed: Feb. 22, 1994

Related U.S. Application Data

[63] Continuation of Ser. No. 667,465, Mar. 11, 1991, abandoned.
[51] Int. Cl.⁶ .................................................. G06F 12/06
[52] U.S. Cl. ................................. 395/421.07; 425/432
[58] Field of Search ........................... 364/200 MS File, 364/900 MS File; 395/400 MS, 425 MS

[56] References Cited

U.S. PATENT DOCUMENTS

| | | | |
|---|---|---|---|
| 3,984,815 | 10/1976 | Drexler et al. | 395/550 |
| 4,225,948 | 9/1980 | Schuller | 365/239 |
| 4,528,665 | 7/1985 | Burns et al. | 371/51 |
| 4,561,070 | 12/1985 | Armstrong | 365/227 |
| 4,701,884 | 10/1987 | Aoki et al. | 365/189 |
| 5,115,413 | 5/1992 | Sato et al. | 365/230.09 |
| 5,134,699 | 7/1992 | Aria et al. | 395/425 |
| 5,251,310 | 10/1993 | Smelser et al. | 395/425 |
| 5,329,629 | 7/1994 | Horst et al. | 395/425 |

*Primary Examiner*—Reba I. Elmore
*Attorney, Agent, or Firm*—Arnold, White & Durkee

[57] ABSTRACT

Methods for addressing a block addressable memory with a Gray code to minimize spurious noise generation and enhance diagnostic operations for data and address bus error detection.

3 Claims, 3 Drawing Sheets

METHOD FOR ADDRESSING A BLOCK ADDRESSABLE MEMORY USING A GRAY CODE

This application is a continuation of application Ser. No. 07/667,465, filed Mar. 11, 1991, now abandoned.

FIELD OF THE INVENTION

The present Invention relates to methods for addressing memory locations in memory systems, and more particularly methods for addressing a block addressable memory with a Gray code to minimize spurious noise generation and enhance diagnostic operations for data and address bus error detection.

BACKGROUND OF THE INVENTION

The address bus for a typical memory system carries addresses that are generated by a plurality of drivers, with one of the drivers for each bit in the address. The drivers are switched on and off to generate binary addresses that correspond to selected memory storage locations.

In a block addressable memory array that is suitable for incorporating the present invention, a selected memory storage location in the selected memory array is accessed by addressing the block in which the memory storage location is assigned. The block address is then converted, by suitable gate array logic, into the word address and memory bank selection address that corresponds to the selected memory storage location. The word address is conveyed on the address bus to the memory array.

The address bus is a source of spurious noise because of the switching action of the drivers that supply or feed the address bus. When a new word address is propagated on the address bus, the entire number of drivers may switch simultaneously, if ordinary binary or binary coded decimal codes are used for identification.

Diagnostic operations on the memory array are also difficult to perform with ordinary addressing schemes. This difficulty exists for any address scheme that has a given number of bits because as many as all of the bits may change during a change of address. If an address error occurs with such addressing schemes, it is difficult to attribute the fault to a specific bit or group of bits in the address bus or memory array.

SUMMARY OF THE INVENTION

The present invention overcomes the difficulties of the prior art addressing schemes by sequentially switching Gray coding of words that are arranged within structured,, randomly accessible data blocks. The data blocks in the preferred embodiment are 320 words long. With this arrangement, the block of data corresponding to a predetermined memory address is randomly selected. Then the addresses of the data words within the selected block are sequentially advanced using a Gray code.

With the Gray code, the difference between sequential numbers is only one bit. Thus, as the words within one of the data blocks are sequentially advanced, only one bit changes for each sequential address change. As a result, spurious noise generation is minimized because only one driver for the address bus switches for each change of address. In addition, any detected address error is attributable to a single bit, which makes the determination of a fault or malfunction in the address bus easier to locate.

DESCRIPTION OF THE PREFERRED EMBODIMENT

Figure 1:
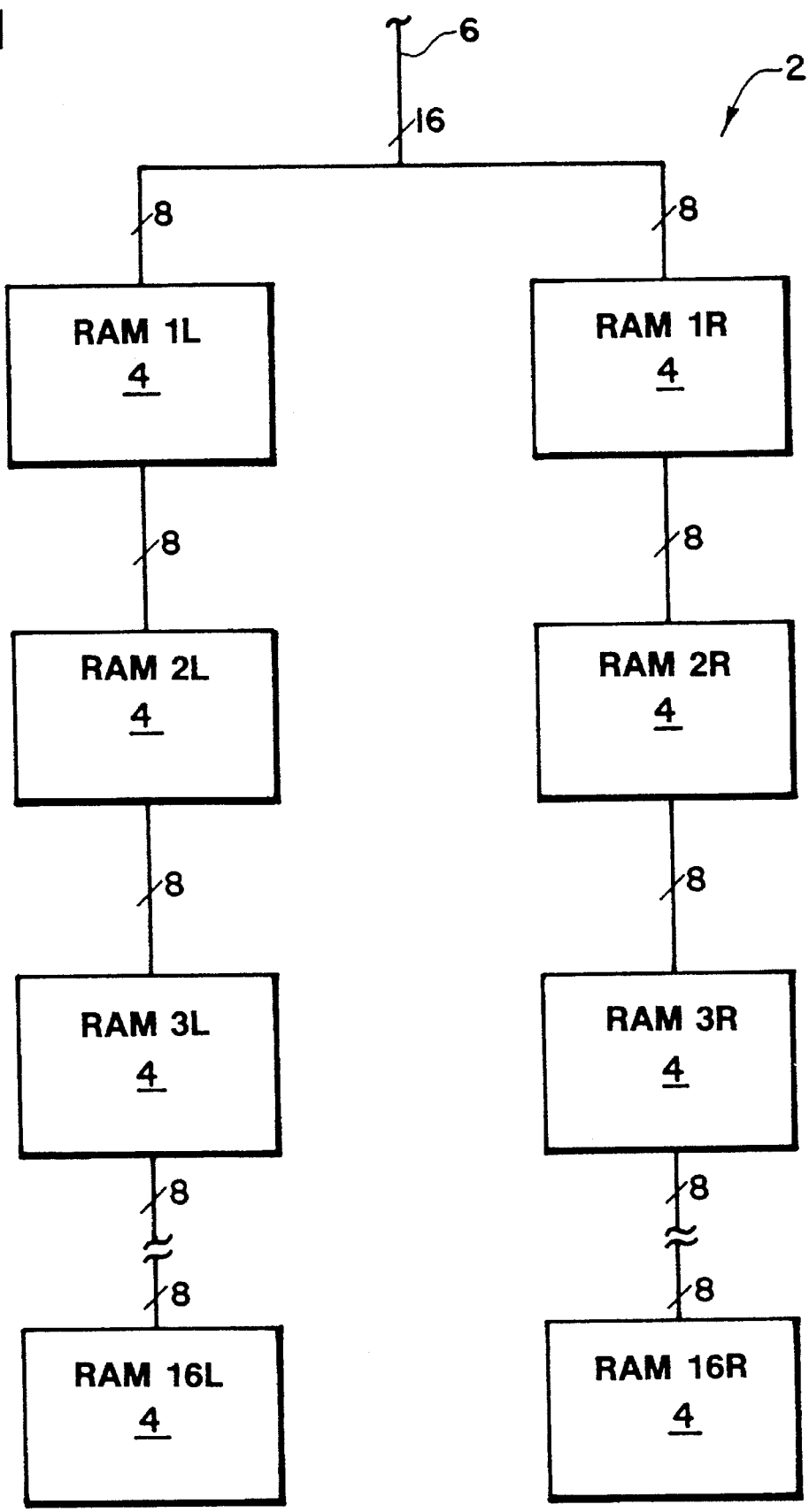
FIG. 1 is a block diagram of a memory array with a configuration suitable for the present invention.

Referring to the drawings, wherein reference characters designate like or corresponding parts throughout the views, FIG. 1 is a block diagram of a typical memory array 2 that is suitable for incorporating the present invention. The array 2 comprises a plurality of random access memory (RAM) units 4. The number of RAM's 4 depends upon design constraints of the particular memory application.

A preferred embodiment for a memory cache used in a disc drive, a total of 32 of the RAM's are used in the array, with each of the RAM's 4 comprising a 128K×8 bit configuration, which actually means that each of the RAM's 4 are configured with 131,072 rows of bytes. This provides a total memory capacity of approximately 4 megabytes, or to be more precise, 4,194,304 bytes.

The RAM's 4 are arranged in the array 2 in two columns and 16 banks. Further, the RAM's 4 are arranged in the array 2 so that they are coupled to a word, or 16 bit width data bus 6. The eight most significant bits of the data bus 6 are supplied to the left column of the RAM's 4 and the eight least significant bits of the data bus 6 are supplied to the right column of the RAM's 4. In this way, each bank of the array 2 comprises two of the RAM's 4, with the data fed into the array 2 in word width segments. Thus, each row of each bank of the RAM's 4 comprises a different addressable word of data.

In the preferred embodiment, the data that is loaded into the array 2 is arranged into data blocks of 640 bytes. This provides a total of 320 words of data per data block. It is also preferred to select the bank of the RAM's 4 and the row within each selected bank of the RAM's 4 to retrieve a selected word of data from the array 2. This means that one of sixteen banks of the RAM's 4 are selected, and then one of the rows of the selected one of the banks of the RAM's 4 are then selected to retrieve a selected word of data.

Figure 2:
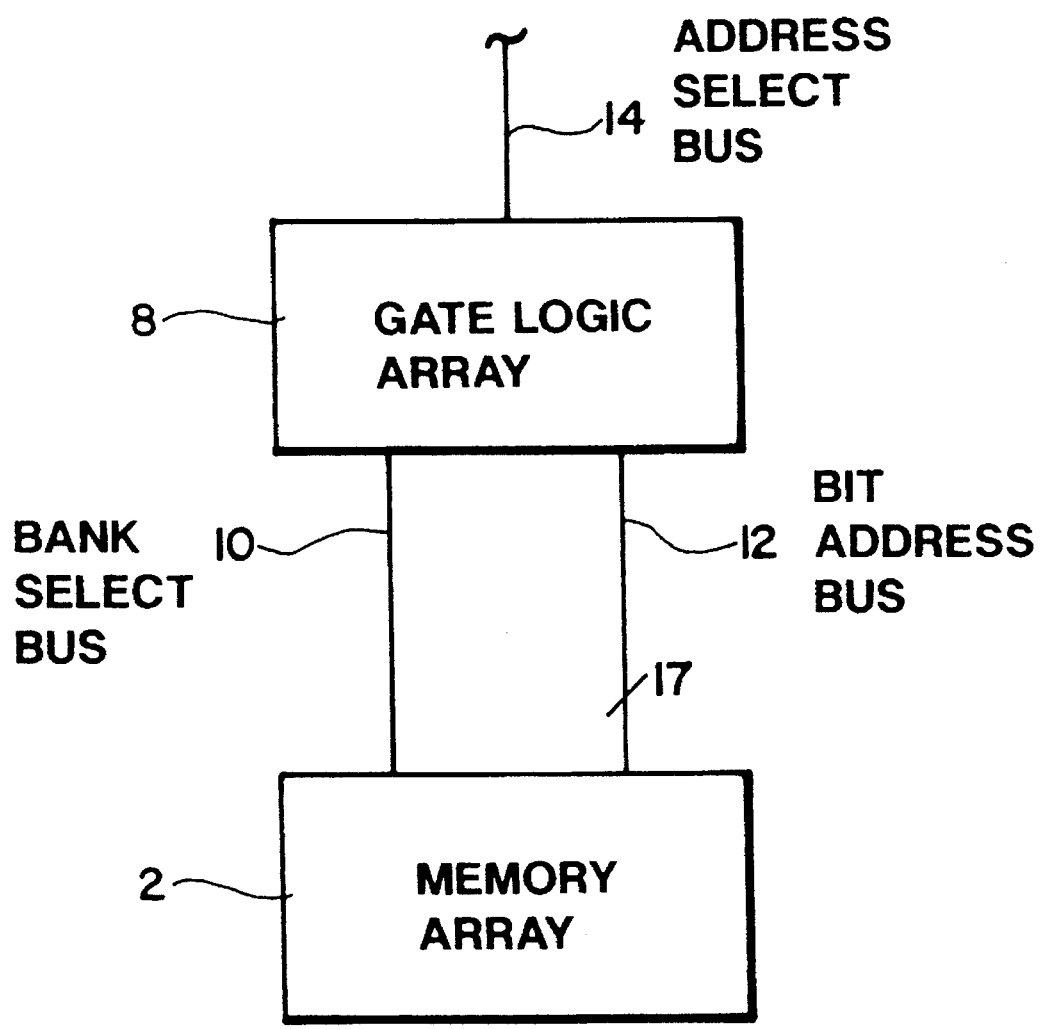
FIG. 2 is a block diagram of an addressing scheme according to the present invention.

The addressing scheme according to the preferred embodiment is represented by the block diagram shown in FIG. 2. The array 2 is addressed by a gate logic array 8. The logic array 8 is well known to those of ordinary skill in the art and provides a bank select address on a bank select bus 10 and a 17 bit RAM select address on a 17 bit address bus 12. The RAM select address selects the row, or word of data, in the bank of the RAM's 4 that is selected with the bank select address.

The logic array 8 provides the bank and RAM addresses in response to an address request on an address request bus 14. The address request on the address request bus 14 corresponds to the block address of the selected word of data. The logic array 8 converts the address request to the proper bank and RAM addresses to retrieve the selected word of data. In the preferred embodiment, the starting address for the block is calculated as the block number times 20. According to the present invention, the RAM addresses for any selected bank are sequentially addressed according to a Gray code.

Figure 3:
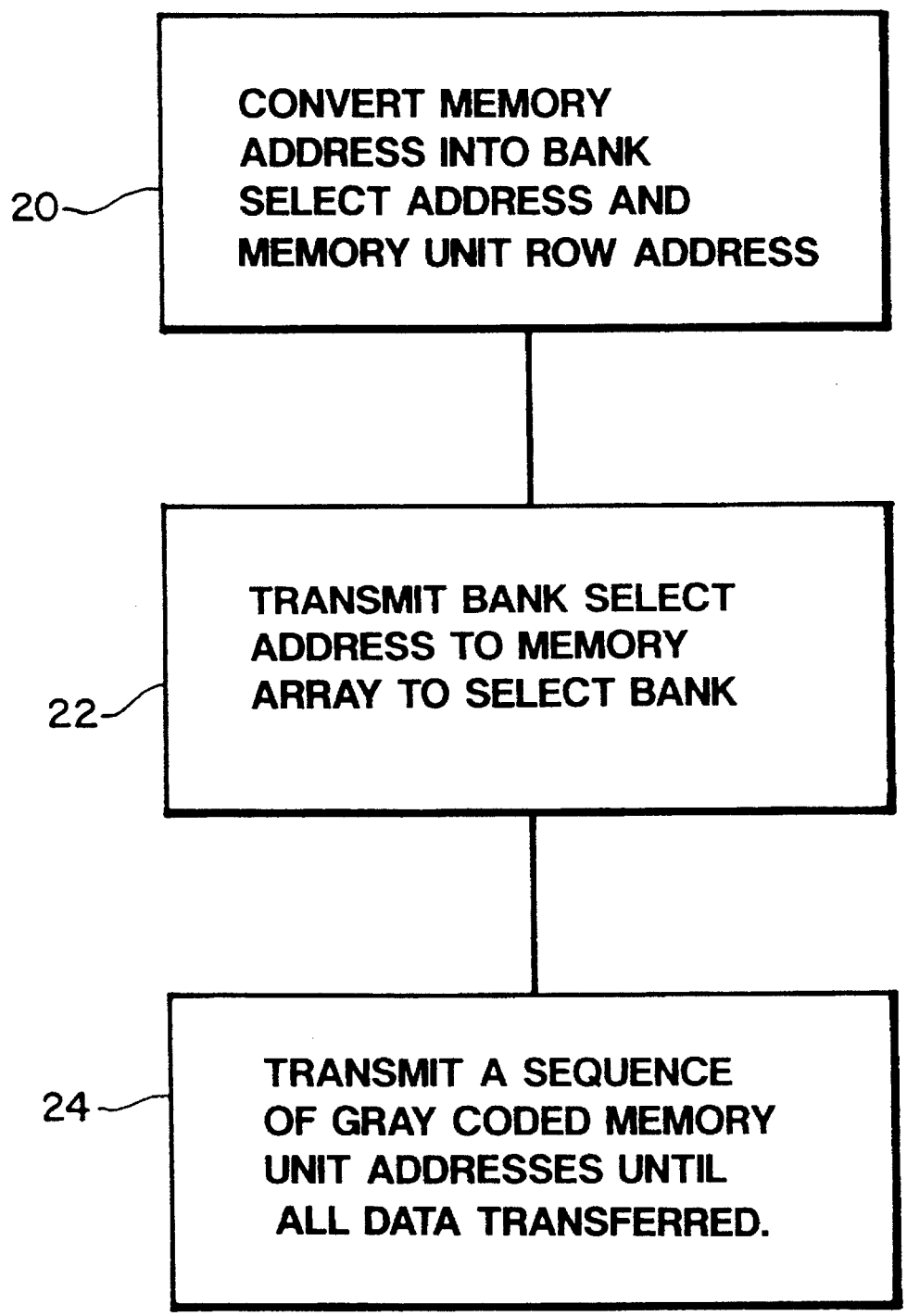
FIG. 3 is a flow chart for the basic methodology of the present invention.

A flow chart of the basic methodology of the present invention is shown in FIG. 3. As described above, the logic array 8 converts the memory address request on the address request bus 14 to a corresponding bank select address and RAM address at step 20. The logic array 8 transmits the bank select address to the memory array 2 via the bank select bus 10 at step 22. The logic array also transmits the RAM address to the memory array 2, and sequentially changes the transmitted RAM address according to the Gray code until all of the data in the addressed data block has been transferred at step 24. It is intended that the use of the word transferred includes both the operation of reading data from memory or the operation of writing data into memory.

With the ordinary configuration of a memory array that has full random access capability, the use of a Gray code for addressing purposes has no discernable advantage over ordinary binary code addressing systems, because as many as all of the bits in the RAM address bus 12 can still switch at the same time. It is only the sequential access memory configuration of the words in each data block combined with the utilization of a Gray code for addressing the words in each data block that the single bit switching feature is possible when the addressing operation occurs on the RAM address bus 12. The sequential word by word RAM addressing according to a Gray code within each randomly accessed data block provides lower spurious noise levels within the memory system since only one bit of the RAM address bus 12 can be switched at any time by the logic array 8.

Another advantage to sequential addressing using a Gray code is with respect to the identification of the failure of an address bit for some reason. According to the preferred embodiment, not only is the address failure detectable, but also the identity of the failed address bit is ascertainable. This is achieved by employing the well known "checkerboard" memory diagnostic in combination with the Gray coded sequential memory addressing.

As a first step of this diagnostic, "5's", or 0101's, are written, and then read, throughout the entire memory array 2, using any addressing scheme. This procedure detects any data bit "stuck ats", because any deviation from the 0101 pattern is evidence of a failure of a data bit to switch.

The second step is to first read 5's and then write "A's" or "1010's", to all of the memory array using a Gray code. Address bus problems show up in this pass as reading A's instead of 5's. This is because an incorrect address that is caused by a failed address bit will cause the A's to be written to an incorrect location, thus eventually causing the reading of a "1010" instead of a "0101".

The last step is to read A's to all of memory to detect data bit "stuck ats". This is because the failure of the previous step to change 5's to A's at any point in memory that is not attributable to a detected address error is due to a stuck data bit.

According to the present invention, if an error occurs during any given memory cycle, then only one bit has changed since the last memory cycle because of the utilization of the sequential addressing with the Gray code. When such error occurs, the error is due to either the failure of an address bit or a data bit. Data bit errors are discernable during the first and third steps with the checkerboard diagnostic. Address bit errors are detected during the second step of the checkerboard diagnostic.

When an address bit is detected as having failed as described above, the failed bit is identifiable as the one that changed in arriving at the current address from the previous address. The failed bit so identified is then reported as part of the diagnostic information.

If a Gray code is not used as described above, it is harder to identify which address bit causes a problem. This is because a plurality of address bits can change simultaneously between the previous address and the current address.

In this connection, Gray codes are most often used to prevent aliasing because they only allow single bit changes between adjacently assigned values. According to the present invention, the Gray code is used to detect aliasing caused by faulty address bits.

Although the preferred embodiment has been described above in terms of the memory array 2 comprising thirty two of the RAM's 4 arranged in two columns of sixteen banks, other configurations are suitable for the memory array 2 using the methodology of the present invention as described above. The memory array 2 may be configured with its memory units 4 arranged in any convenient combination of columns and banks, and the memory array 2 may comprise any number of the memory units 4. Likewise, each of the memory units 4 may have a greater or lesser memory capacity with a greater or lesser number of addressable rows of bits.

For instance, the memory array 2 may comprise 64 of the RAM's 4 with the 128K×8 bit configuration. In this case, the RAM addresses for the memory units 4 of the memory array 2 are sequentially addressed over the seventeen bit RAM address bus 12 by the logic array 8 exactly as described for the preferred embodiment, because the number of RAM addresses remains the same.

Likewise, the number of addressable rows of bits may vary if the RAM's 4 have a configuration other than that described for the preferred embodiment. For instance, if the RAM's 4 have a configuration of 256K×8 bits, such that each of the RAM's 4 have 262,144 addressable bytes, or rows, the logic array 8 must perform the RAM addressing with an eighteen bit Gray code. In this case, the RAM address bus 12 must have at least eighteen bits as well.

The RAM's 4 may be configured within the memory array 2 to be in more or less than two columns per bank. For instance, when the memory units 4 have a 128K×8 bit configuration, a single column of the memory units 4 per bank means that each RAM row address comprises an addressable byte of data. This means that the data blocks are divided into bytes of data, so that the logic array 8 sequentially changes the address on the RAM address bus 12 for each byte of data within each addressed data block.

In the preferred embodiment, the two columns of memory units 4 provide an addressable word of data per RAM row address. This means that each data block is divided into words of data, as explained above, so that the logic array 8 sequentially changes the address on the Ram address bus 12 for each word of data within each addressed data block.

Four columns of the memory units 4 per bank provide an addressable longword of data per RAM row address, thus dividing each data block into longwords of data, and so forth. The division of the memory array into a different number of banks and columns thus affects the effective partitioning of the data blocks that are transferred in and out of the memory array 2.

Thus, there has been described above methodology for an addressing scheme for the memory array of a memory system that minimizes the generation of spurious noise and enhances diagnostic operations. It should be understood that various changes in the details, methodology, parts, and configurations described above to explain the nature of the present invention may be made by those skilled in the art within the principle and scope of the present invention as expressed in the appended claims.

What is claimed is:

1. A method of addressing block-addressable data in a memory array, said memory array having a plurality of memory units arranged in individually addressable banks, each memory unit in said memory array having a plurality of randomly accessible blocks and each block having a plurality of individually addressable rows of bits, the method comprising the steps of:

transmitting from a data requestor a memory address request for reading a randomly accessible block of data from said memory array or writing said randomly accessible block of data into said memory array;

receiving from said data requestor said memory address request;

converting said received memory address request into a bank select address and a memory unit row address, said bank select address corresponding to one of said individually addressable banks of memory units and said row address corresponding to a first row of said randomly accessible block of data from said memory array;

transmitting said bank select address to said memory array for selecting one of said individually addressable banks of memory units; and sequentially transmitting a sequence of Gray coded memory unit row addresses to selected one of said individually addressable banks of memory units beginning at said converted memory unit row address to sequentially change said memory unit row address according to a Gray code until all said data in said one block of said plurality of blocks has been read from said memory array or written into said memory army such that all of said individually addressable rows of bits within said one block are exclusively read or exclusively written according to said memory address request, without an intervening memory operation to said one block.

2. The method recited in claim 1, wherein each of said individually addressable banks comprises at least two of said memory units thereby forming two columns of said memory units, and said step of transmitting said bank select address comprises transmitting said bank select address to said individually addressable bank of memory units.

3. The method recited in claim 1, wherein said memory array comprises a plurality of said individually addressable banks each having at least two of said memory units, and said step of transmitting said bank select address comprises a random access transmission of said bank select address.

* * * * *